(12) United States Patent
Vinson et al.

(10) Patent No.: US 7,813,120 B2
(45) Date of Patent: Oct. 12, 2010

(54) AIRFLOW PATH WITHIN AN ELECTRONIC MODULE ENCLOSURE

(75) Inventors: Wade D. Vinson, Magnolia, TX (US); David W. Sherrod, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 160 days.

(21) Appl. No.: 12/138,625

(22) Filed: Jun. 13, 2008

(65) Prior Publication Data
US 2008/0310107 A1 Dec. 18, 2008

Related U.S. Application Data

(60) Provisional application No. 60/943,677, filed on Jun. 13, 2007, provisional application No. 60/943,977, filed on Jun. 14, 2007.

(51) Int. Cl.
*H05K 5/00* (2006.01)
*A47B 77/08* (2006.01)

(52) U.S. Cl. ............... 361/679.5; 361/679.48; 361/679.49; 361/679.51; 361/695; 361/724; 454/184; 312/236

(58) Field of Classification Search .......... 361/679.48, 361/679.49, 679.5, 679.51, 694–695, 724–727; 454/184; 312/236
See application file for complete search history.

(56) References Cited

U.S. PATENT DOCUMENTS

| 2001/0046118 A1* | 11/2001 | Yamanashi et al. .......... 361/687 |
| 2002/0015287 A1 | 2/2002 | Shao |
| 2002/0080575 A1 | 6/2002 | Nam et al. |
| 2003/0030976 A1 | 2/2003 | Garnett et al. |
| 2003/0030978 A1 | 2/2003 | Garnett et al. |
| 2003/0033360 A1 | 2/2003 | Garnett et al. |
| 2003/0033459 A1 | 2/2003 | Garnett |
| 2004/0016257 A1 | 1/2004 | Wei |
| 2005/0015531 A1 | 1/2005 | Yabuta et al. |
| 2005/0217829 A1 | 10/2005 | Belits et al. |
| 2006/0253633 A1 | 11/2006 | Brundridge et al. |
| 2007/0109741 A1 | 5/2007 | Seibold |

FOREIGN PATENT DOCUMENTS

| GB | 2 378 584 | 2/2003 |
| WO | WO 03/014893 | 2/2003 |
| WO | WO 03/083631 | 10/2003 |

* cited by examiner

*Primary Examiner*—Zachary M Pape

(57) ABSTRACT

An enclosure houses electronic modules in a front region and a rear region. Airflow can be transferred through electronic modules in the front region and into a plenum. An airflow path in the enclosure transfers airflow from the front region of the enclosure to electronic modules housed in the rear region of the enclosure. Airflow is transferred through the electronic modules in the rear region and into the plenum.

17 Claims, 3 Drawing Sheets ized closer to side 202 (i.e., 120a-d) and four of which are positioned closer
AIRFLOW PATH WITHIN AN ELECTRONIC MODULE ENCLOSURE

CROSS-REFERENCE TO RELATED APPLICATIONS

This Utility Patent Application is based on and claims the benefit of U.S. Provisional Application No. 60/943,677, filed on Jun. 13, 2007, and U.S. Provisional Application No. 60/943,977, filed Jun. 14, 2007, the contents of which are both hereby incorporated by reference in their entirety.

BACKGROUND

Server enclosures can house a variety of electrical components. In current enclosures, components located at a rear of the enclosure can receive air that has been heated by components in a front of the enclosure. As a result, increased fan power is needed such that components positioned in the rear of the enclosure receive adequate airflow.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
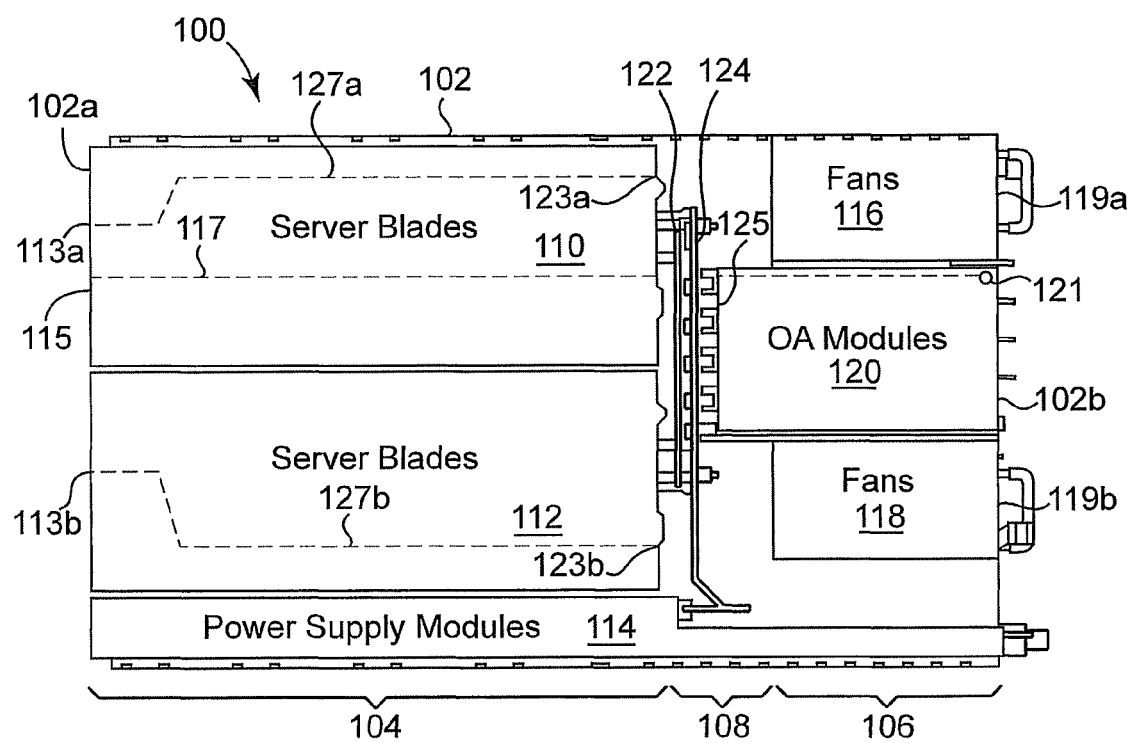
FIG. 1 is a side view of one embodiment of a server enclosure.

FIG. 1 is a schematic view of one embodiment of a computer enclosure 100. Enclosure 100 includes a chassis 102 having a front face 102a defining a first end of the chassis and a rear face 102b defining a second end of the chassis. In one embodiment, enclosure 100 is arranged in a front region 104, a back region 106, and a central plenum 108 position between the front region 104 and the back region 106. In one embodiment, as described below, chassis 102 includes a plurality of sections for housing components therein. It is worth noting that any number of electronic modules, air movers and other components can be positioned within chassis 102 as desired.

In the illustrated embodiment, front region 104 includes a module or server region having a plurality of upper bays 110 and lower bays 112 for housing electronic modules (e.g., server blades, storage blades, optical drives) and airflow inlets 113a and 113b to allow air to flow into bays 110 and 112, respectively. In one embodiment, front region 104 also houses one or more power supply modules in section 114. In one embodiment, a second airflow inlet 115 is fluidly coupled to an airflow path 117 that transfers airflow from front region 104 to rear region 106 while bypassing servers in bays 110 and 112.

In one embodiment, back region 106 is adapted to house a plurality of air movers in sections 116 and 118 as well as other modules (e.g., keyboard video mouse modules, interconnect modules, onboard administration modules) in section 120. In one embodiment, airflow path 117 is fluidly connected to modules in section 120 through an airflow inlet 121 to provide fresh air from airflow inlet 115 to modules housed in section 120.

During operation, fans in sections 116 and 118 draw air through airflow inlets 113a and 113b and into bays 110 and 112 to provide cooling to electronic modules housed therein. Air then flows through bays 110 and 112 and into central plenum 108 through airflow outlets 123a and 123b, creating airflow paths 127a and 127b.

In one embodiment, fans in sections 116 and 118 also operate to bring airflow into airflow path 117 through airflow inlet 115. In one embodiment, airflow path 117 extends from front face 102a to rear region 106 near back face 102b to airflow inlet 121 of modules in section 120. Air then flows through modules in section 120 to an airflow outlet 125 to central plenum 108. In one embodiment, air is aggregated from modules in bays 110 and 112 and section 120 into central plenum 108, and ultimately exits chassis 102 through airflow outlets 119a and 119b in rear face 102b.

In one embodiment, enclosure 100 also includes a signal midplane module 122 and a backplane power module 124. Signal midplane module 122 is provided to transmit signals between servers in bays 110 and 112 and modules in section 120. Backplane power module 124 is provided to distribute power from power supply modules in section 114 to electrical components stored within chassis 102.

Figure 2:
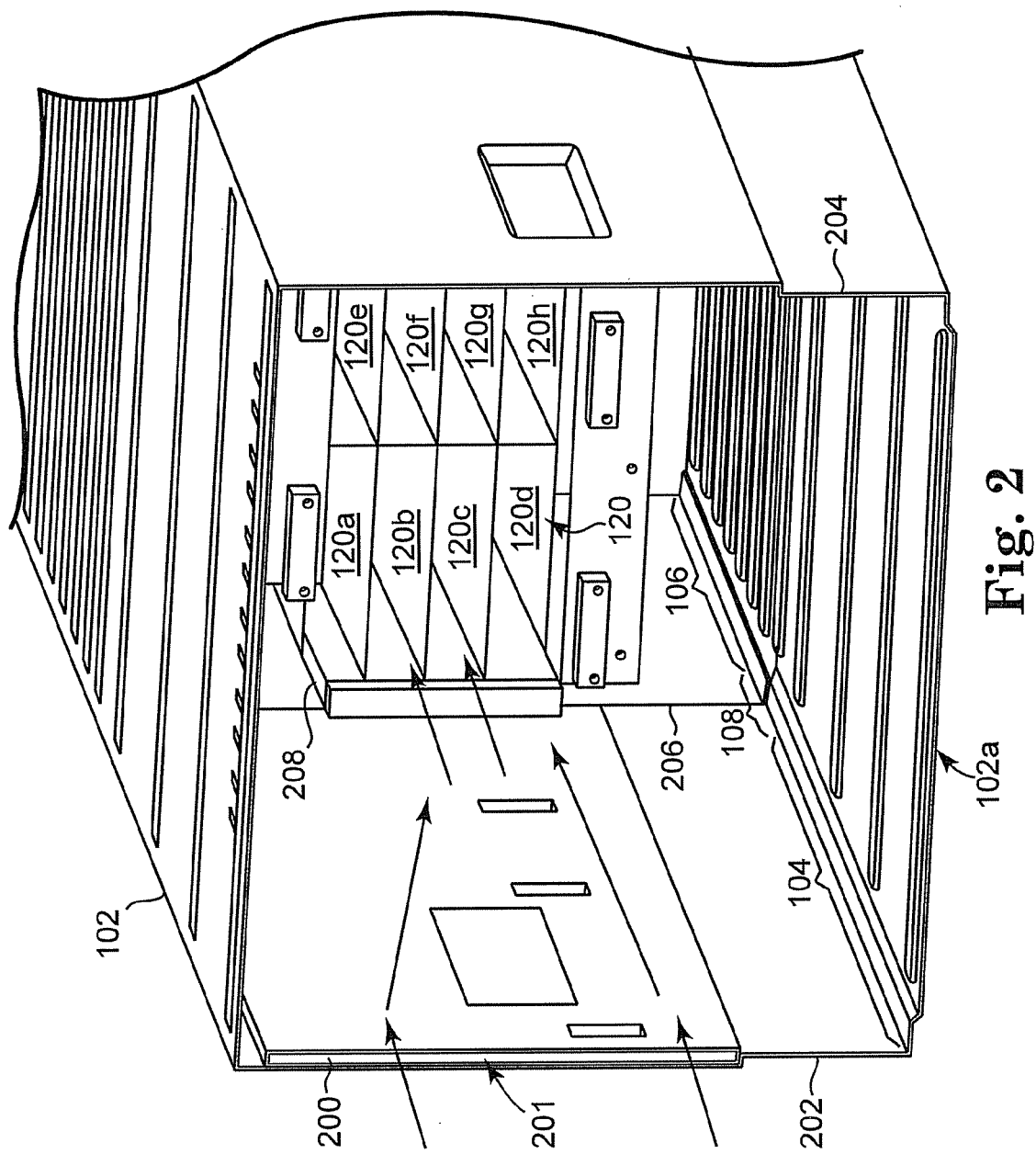
FIG. 2 is an isometric view of one embodiment of a chassis of a server enclosure.

FIG. 2 is an isometric view of one embodiment of chassis 102. In one embodiment, chassis 102 includes a snorkel 200 having an airflow opening 201 positioned on one side, for example, a left side 202, of chassis 102. A second snorkel (not shown) can be provided on an opposite side, for example, a right side 204, of chassis 102. In one embodiment, snorkel 200 is generally rectangular and extends along side 202 to a mid portion 206 of chassis 102. In one embodiment, a conduit 208 brings air from snorkel 200 to a rear of chassis 102 from mid portion 206 and into modules in section 120.

In one embodiment, modules that may need a higher amount of airflow (e.g., servers) can be positioned in front region 104. Thus, a larger area of face 102a can be dedicated to providing airflow to front region 104. Modules that may need a lower amount of airflow (e.g., interconnect modules) can be positioned in rear region 106. In one embodiment, since rear region 106 can have a lower airflow, snorkel 200 can be designed to utilize a small area of front face 102a so as to be sized to provide an adequate amount of airflow to modules in rear region 106 through snorkel 200.

As illustrated in the embodiment of FIG. 2, section 120 includes a number of compartments for electronic modules. In one exemplary embodiment, section 120 includes eight compartments 120a-h, four of which are positioned closer to side 202 (i.e., 120a-d) and four of which are positioned closer to side 204 (i.e., 120e-h). Compartments 120a-d are fluidly coupled to airflow inlet 201 through snorkel 200 and conduit 208. It is worth noting that, in one embodiment, conduit 208 can comprise one or more separate airflow paths to transfer airflow to each of compartments 120a-d.

In one embodiment, airflow is transferred to compartments 120e-h using a second airflow path on side 204. The second airflow path may include including a snorkel and conduit similar to snorkel 200 and conduit 208, as described below with respect to FIG. 3.

Figure 3:
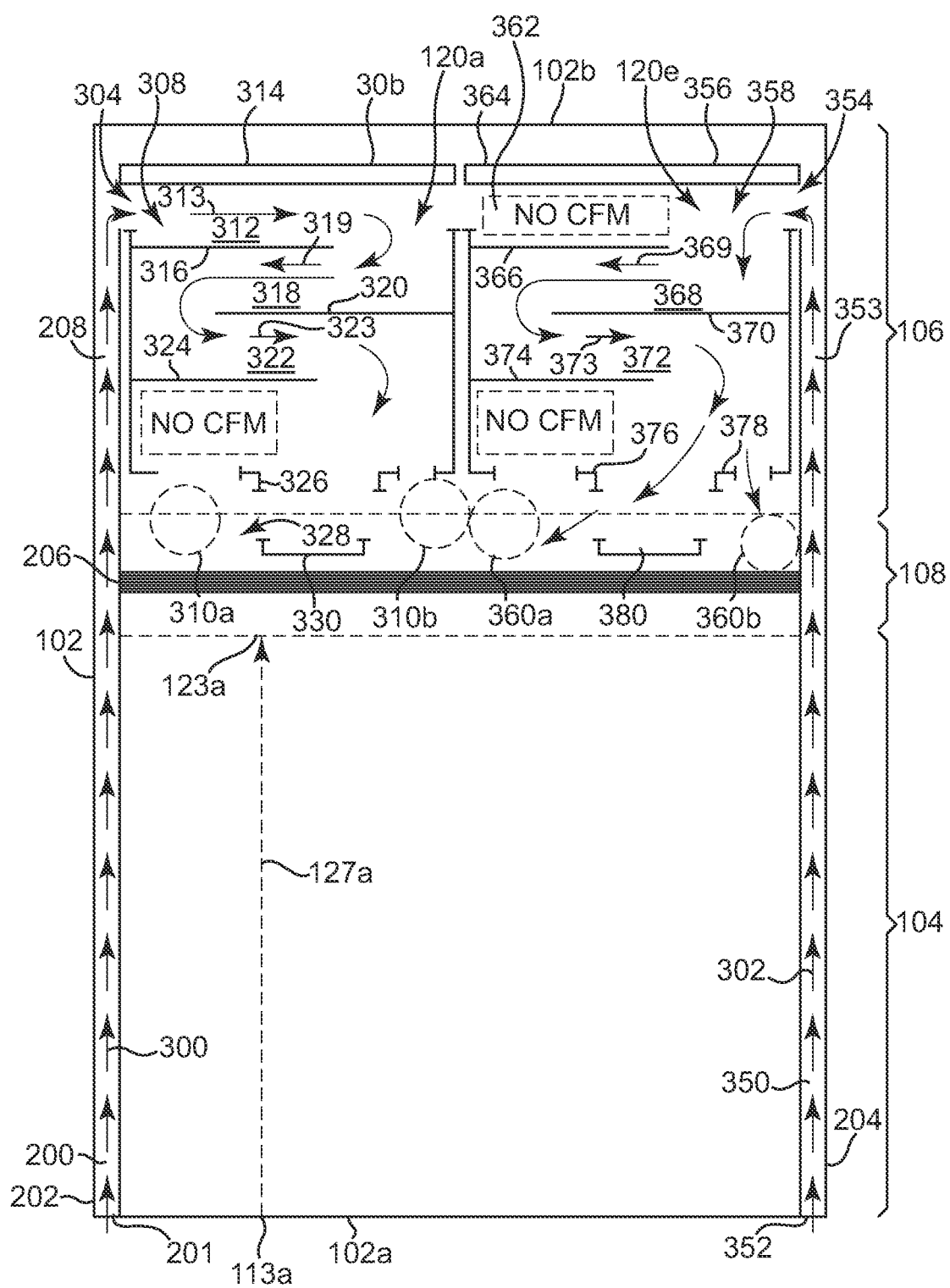
FIG. 3 is a schematic top view of one embodiment of airflow paths in a server enclosure.

FIG. 3 is a schematic top view of one embodiment of airflow paths 300 and 302 in chassis 102. In one embodiment, airflow path 300 is created along a length of chassis 102 from airflow inlet 201 to snorkel 200, through conduit 208 and into a rear airflow inlet 304. In one embodiment, airflow inlet 304 leads into an electronic module 306 housed in compartment 120a of section 120. In one embodiment, other compartments in section 120 can be similarly constructed.

In one embodiment, electronic module 306 includes a circuitous path 308 that transfers air through electronic module 306 to airflow outlets 310a and 310b. In one embodiment, airflow outlets 310a and 310b are fluidly coupled to central plenum 108, which can exit air through fans in sections 116 and 118 (FIG. 1).

In one embodiment, circuitous path 308 includes a first portion 312 defined by an end wall 314 and a first interior wall 316 such that air travels through portion 312 in direction 313 away from side 202. In one embodiment, a second portion 318 of path 308 is defined by first interior wall 316 and a second interior wall 320 such that second portion 318 transfers airflow in a direction 319 opposite that of portion 312. In one embodiment, a third portion 322 of circuitous path 308 is formed of interior wall 320 and a third interior wall 324 such that third portion 322 transfers air flow in a direction 323 opposite that of second portion 318 and similar to that of first portion 312. In one embodiment, airflow transfers from third portion 322 to airflow outlets 310a and 310b, as directed by diversion walls 326, 328, and 330.

In one embodiment, airflow path 302 includes a second snorkel 350 is provided on a right side 204 of chassis 102. In one embodiment, snorkel 350 is similarly constructed to snorkel 200 such that an airflow inlet 352 is fluidly coupled to snorkel 350 to bring air along right side 204 from front region 104 and into conduit 353 in back region 106. In one embodiment, an airflow inlet 354 leads into an electronic module 356 similar to electronic module 306. In one embodiment, electronic module 356 includes a circuitous path 358 similar to circuitous path 308 such that the circuitous path 358 leads to airflow outlets 360a and 360b, which lead to central plenum 108.

In one embodiment, path 358 includes a first portion 362 defined by an end wall 364 and a first interior wall 366 such that airflow from inlet 354 bypasses first portion 362 and transfers to a second portion 368, defined by first interior wall 366 and a second interior wall 370. In one embodiment, second portion 368 transfers airflow in a direction 369 away from side 204. In one embodiment, from second portion 368, airflow transfers to a third portion 372 defined by second interior wall 370 and a third interior wall 374 such that third portion 372 transfers airflow in a direction 373 toward side 204. Airflow transfers from third portion 372 to airflow outlets 360a and 360b as directed by diversion walls 376, 378 and 380.

As discussed herein, airflow can enter front face 102a through a plurality of airflow inlets (e.g., airflow inlets 113a, 210 and 352) and be transferred to a common plenum 108, which is coupled to a plurality of airflow outlets (e.g., 123a, 310a, 310b, 360a, 360b) first and second airflow paths (e.g., 300 302) can lead from the front face 102a to components in rear region 106 to provide airflow to the components.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An enclosure for electronic modules, comprising:
   a chassis including a first end and a second end;
   a front region proximate the first end of the chassis and housing a first plurality of electronic modules, the front region including a first airflow inlet positioned at the first end of the chassis and a first airflow outlet;
   a rear region proximate the second end of the chassis and housing a second plurality of electronic modules, the rear region including a second airflow inlet and a second airflow outlet, the second airflow inlet positioned closer to the second end than the second airflow outlet such that airflow through the second plurality of electronic modules is transferred from the second end toward the first end;
   an airflow path having a third airflow inlet positioned at the first end of the chassis and fluidly coupled to the second airflow inlet of the rear region; and
   a plenum positioned between the front region and the rear region and fluidly coupled to receive airflow from the first airflow outlet of the front region and the second airflow outlet of the rear region and transfer airflow to a third airflow outlet such that airflow is transferred from the first end to the second end along the airflow path and back toward the first end from the second airflow inlet to the second airflow outlet.

2. The enclosure of claim 1 wherein the airflow path is positioned on a side of the chassis to transfer airflow from the first end of the chassis to the rear region.

3. The enclosure of claim 1 and further comprising:
   a plurality of fans positioned in the rear region of the chassis to transfer airflow from the third airflow outlet of the plenum and out the second end of the chassis.

4. The enclosure of claim 1 wherein each of the second plurality of electronic modules include a circuitous path transferring airflow from the second airflow inlet to the second airflow outlet, the circuitous path including a first portion transferring airflow in a first direction and a second portion transferring airflow in a second direction, opposite the first direction.

5. The enclosure of claim 1 and further comprising:
   a third plurality of electronic modules positioned in the rear region and having a fourth airflow inlet and a fourth airflow outlet fluidly coupled to the plenum; and
   a second airflow path having a fifth airflow inlet positioned at the first end of the chassis and fluidly coupled to the fourth airflow inlet.

6. An enclosure for electronic modules, comprising:
   a chassis having a first end and a second end;
   a front region position proximate the first end of the chassis and housing a first plurality of electronic modules, the front region including a first airflow inlet positioned at the first end and a first airflow outlet;
   a rear region spaced apart from the first end of the chassis and housing a second plurality of electronic modules, the rear region including a second airflow inlet and a second airflow outlet, each of the second plurality of electronic modules including a circuitous path fluidly coupled between the second airflow inlet and the second airflow outlet and having a first portion transferring airflow in a first direction and a second portion transferring airflow in a second direction opposite the first direction; and an airflow path positioned at the first end of the chassis and fluidly coupled to the second airflow inlet of the rear region.

7. The enclosure of claim 6 wherein the airflow path is positioned on a side of the chassis to transfer airflow from the first end to the rear region.

8. The enclosure of claim 6 and further comprising:
a plenum positioned between the front region and the rear region, the plenum fluidly coupled to receive airflow from the first airflow outlet of the front region and the second airflow outlet of the rear region and transfer airflow to a third airflow outlet.

9. The enclosure of claim 8 and further comprising:
a plurality of fans positioned in the rear region of the chassis to transfer airflow from the third airflow outlet of the plenum and out the second end of the chassis.

10. The enclosure of claim 8 and further comprising:
a third plurality of electronic modules positioned in the rear region and having a fourth airflow inlet and a fourth airflow outlet fluidly coupled to the plenum; and
a second airflow path having a fifth airflow inlet positioned at the first end of the chassis and fluidly coupled to the fourth airflow inlet.

11. The enclosure of claim 10 wherein each of the third plurality of electronic modules include a circuitous path transferring airflow from the fourth airflow inlet to the fourth airflow outlet, the circuitous path including a first portion transferring airflow in a first direction and a second portion transferring airflow in a second direction, opposite the first direction.

12. The enclosure of claim 10 wherein the first-mentioned airflow path is positioned on a first side of the chassis and the second airflow path is positioned on a second side of the chassis opposite the first side.

13. A method for cooling electronic modules in an enclosure, comprising:
providing a chassis having a first end and a second end;
housing a first plurality of electronic modules in a front region of the chassis, the front region including a first airflow inlet positioned at the first end of the chassis and a first airflow outlet;
housing a second plurality of electronic modules in a rear region of the chassis, the rear region including a second airflow inlet positioned at the first end of the chassis and a second airflow outlet, wherein each of the second plurality of electronic modules include a circuitous path fluidly coupled between the second airflow inlet and the second airflow outlet, the circuitous path having a first portion transferring airflow in a first direction and a second portion transferring airflow in a second direction opposite the first direction;
providing an airflow path in the chassis, the airflow path having a third airflow inlet positioned at the first end of the chassis and fluidly coupled to the second airflow inlet; and
providing a plenum to receive airflow from the first airflow outlet and the second airflow outlet and transfer airflow to a third airflow outlet.

14. The method of claim 13 wherein the airflow path is positioned on a side of the chassis to transfer airflow from the first end of the chassis to the rear region.

15. The method of claim 13 and further comprising:
providing a plurality of fans in the rear region of the chassis and operating the fans to transfer airflow from the third airflow outlet of the plenum and out the second end of the chassis.

16. The method of claim 13 and further comprising:
housing a third plurality of electronic modules in the rear region, the third plurality of electronic modules having a fourth airflow inlet and a fourth airflow outlet fluidly coupled to the plenum; and
providing a second airflow path having a fifth airflow inlet positioned at the first end of the chassis and fluidly coupled to the fourth airflow inlet.

17. The method of claim 16 wherein the first-mentioned airflow path is positioned on a first side of the chassis and the second airflow path is positioned on a second side of the chassis opposite the first side.

\* \* \* \* \*